(12) United States Patent
Barcomb et al.

(10) Patent No.: US 6,785,413 B1
(45) Date of Patent: Aug. 31, 2004

(54) RAPID DEFECT ANALYSIS BY PLACEMENT OF TESTER FAIL DATA

(75) Inventors: Kevin J. Barcomb, Burlington, VT (US); Leendert M. Huisman, South Burlington, VT (US); Kevin C. Quandt, Milton, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/379,772

(22) Filed: Aug. 24, 1999

(51) Int. Cl.[7] .............................................. G06K 9/00
(52) U.S. Cl. .......................... 382/149; 716/4; 703/15
(58) Field of Search ............................. 382/145, 147, 382/149; 714/33, 40, 42, 54, 700, 728, 732, 738, 733, 736; 438/10, 17; 348/87; 324/73.1; 703/13, 15; 716/4, 6

(56) References Cited

U.S. PATENT DOCUMENTS

| | | | | |
|---|---|---|---|---|
| 4,497,056 A | * | 1/1985 | Sugamori | 714/736 |
| 4,519,078 A | * | 5/1985 | Komonytsky | 714/728 |
| 4,547,882 A | * | 10/1985 | Tanner | 714/755 |
| 4,817,093 A | * | 3/1989 | Jacobs et al. | 714/728 |
| 4,985,927 A | | 1/1991 | Norwood et al. | |
| 5,086,477 A | * | 2/1992 | Yu et al. | 382/145 |
| 5,157,668 A | * | 10/1992 | Buenzli, Jr. et al. | 714/26 |
| 5,189,365 A | * | 2/1993 | Ikeda et al. | 703/13 |
| 5,319,570 A | | 6/1994 | Davidson et al. | |
| 5,351,247 A | * | 9/1994 | Dow et al. | 706/911 |
| 5,386,423 A | * | 1/1995 | Koo et al. | 714/726 |
| 5,390,131 A | | 2/1995 | Rohrbaugh et al. | |
| 5,570,376 A | * | 10/1996 | Kunda et al. | 714/736 |
| 5,586,058 A | | 12/1996 | Aloni et al. | |
| 5,663,967 A | * | 9/1997 | Lindberg et al. | 714/737 |
| 5,720,031 A | * | 2/1998 | Lindsay | 714/42 |
| 5,761,064 A | | 6/1998 | La et al. | |
| 5,761,213 A | * | 6/1998 | Adams et al. | 714/733 |
| 5,777,901 A | | 7/1998 | Berezin et al. | |
| 5,787,190 A | * | 7/1998 | Peng et al. | 382/145 |
| 5,978,935 A | * | 11/1999 | Kim et al. | 714/42 |
| 6,070,252 A | * | 5/2000 | Xu et al. | 714/30 |
| 6,081,465 A | * | 6/2000 | Wang et al. | 365/201 |
| 6,278,956 B1 | * | 8/2001 | Leroux et al. | 702/117 |
| 6,292,317 B1 | * | 9/2001 | Alexander | 360/31 |
| 6,651,197 B1 | * | 11/2003 | Wildes et al. | 714/726 |

\* cited by examiner

*Primary Examiner*—Jayanti K. Patel
*Assistant Examiner*—Sheela Chawan
(74) *Attorney, Agent, or Firm*—McGinn & Gibb, PLLC; Robert A. Walsh, Esq.

(57) ABSTRACT

A structure and method for identifying a physical location of a defect in a logic circuit based on a physical location of a logic latch having failing data. The logic circuit includes a plurality of logic latches, each having a predetermined physical location within the logic circuit. The logic latches are connected to devices adjacent the logic latches, such that the failing data in the logic latch indicates a failure of a device adjacent the logic latches.

20 Claims, 4 Drawing Sheets

RAPID DEFECT ANALYSIS BY PLACEMENT OF TESTER FAIL DATA

BACKGROUND OF THE INVENTION

1. Field of the Invention

The present invention generally relates to the testing of logic circuits and more particularly to a method and system of determining the physical location of defects by referring to the previously known physical location of latches which contain failing data.

2. Description of Related Art

Identifying the locations of defects on a wafer is one of the main tools used to determine the attributes of defects, such as clustering, wafer scale patterns, spatial trends, etc. To see such trends or patterns, defects on large numbers of wafers are identified and their locations displayed. Traditionally, this is done by physically identifying the defects and plotting their locations on a wafer map. This is a very time consuming process and can be done only occasionally for full wafers. Otherwise, it is done only incidentally for failing chips that have been identified in some sense as "interesting".

SUMMARY OF THE INVENTION

It is, therefore, an object of the present invention to provide a structure and method for identifying a physical location of a defect in a logic circuit based on a physical location of a logic latch having failing data. The logic circuit includes a plurality of logic latches, each having a predetermined physical location within the logic circuit. The contents of the logic latch is determined by a clock signal and by logic devices that are generally in the neighborhood of the latch. Therefore, the latch having incorrect data indicates the presence of a defect in the latch itself or on the clock line or in the logic devices in the vicinity of the latch.

With the invention, a map of the physical location of the logic latch having failing data can be easily made and the proximity of the logic latches having failing data can be determined. The invention can be used to recognize a pattern of the logic latches having failed data to determine if similar patterns of failing locations occur on other similarly manufactured logic circuits. Therefore, the manufacturing process for a logic circuit layout can be adjusted based on the pattern. Also, potential defect locations can be determined by examining visual inspection data in the vicinity of failing logic latches. Thus, the invention uses information about the defect to improve manufacturing yield and/or to improve yield analysis.

In another embodiment, the invention is a method of locating a physical location of a defect in a logic circuit that includes establishing test connections with the logic circuit, identifying physical locations of the logic latches and supplying test signals, wherein defective portions of the logic circuit will produce failing data in the logic latches thereby identifying a physical location of the defect in the logic circuit based on a physical location of a logic latch having failing data.

With the invention somewhat accurate full wafer maps can be obtained within minutes. The resulting wafer maps can help identify defect categories, thereby improving manufacturing yield and/or yield analysis, etc. Because of the rapid turnaround achieved with the invention, the productivity of test and failure analysis is improved, and the yield learning time is shortened.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS OF THE INVENTION

The present invention uses tester data to derive approximate location(s) of defect(s) on integrated circuit wafers. The invention identifies the approximate locations of the latches that contain failing data as indicators of the location (s) of the actual defect(s). These latch locations can be obtained from the chip design layout data, are known before testing starts, and can be consulted as soon as the tester fail data are available. The locations of the latches that contain failing data are drawn on a map. The resulting approximate defect maps can be produced within minutes after the test data have become available.

The invention is applicable to any type of testing where the test brings a device to some test-dependent known state, pulses one or more system clocks, and analyzes the test results by observing the contents of latches and other memory elements resident on the device being tested. For example, scan based testing is a way of performing the foregoing testing. However, the invention is not limited to scan based testing and is applicable to any testing method which complies with the foregoing.

Figure 2:
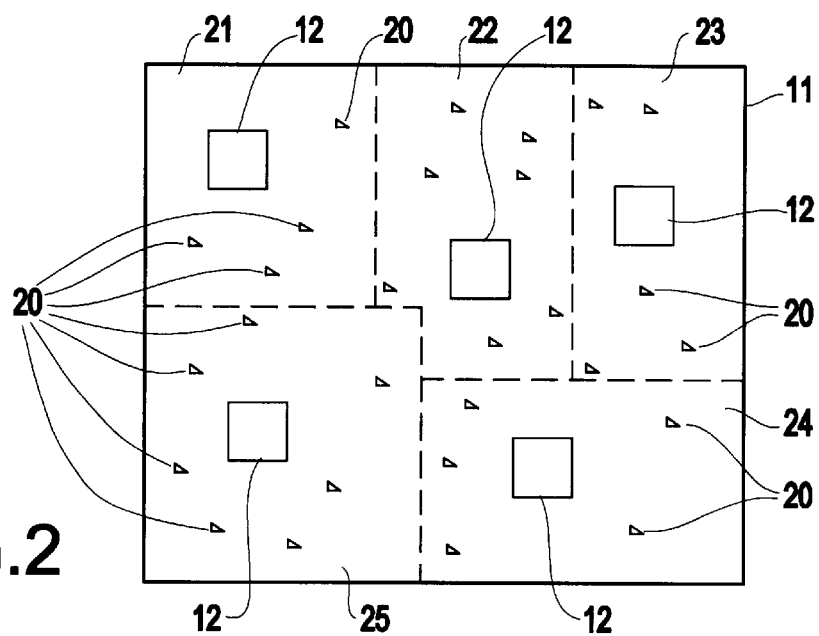
FIG. 2 is a schematic diagram of a chip according to the invention showing latches and logic devices.
Figure 3:
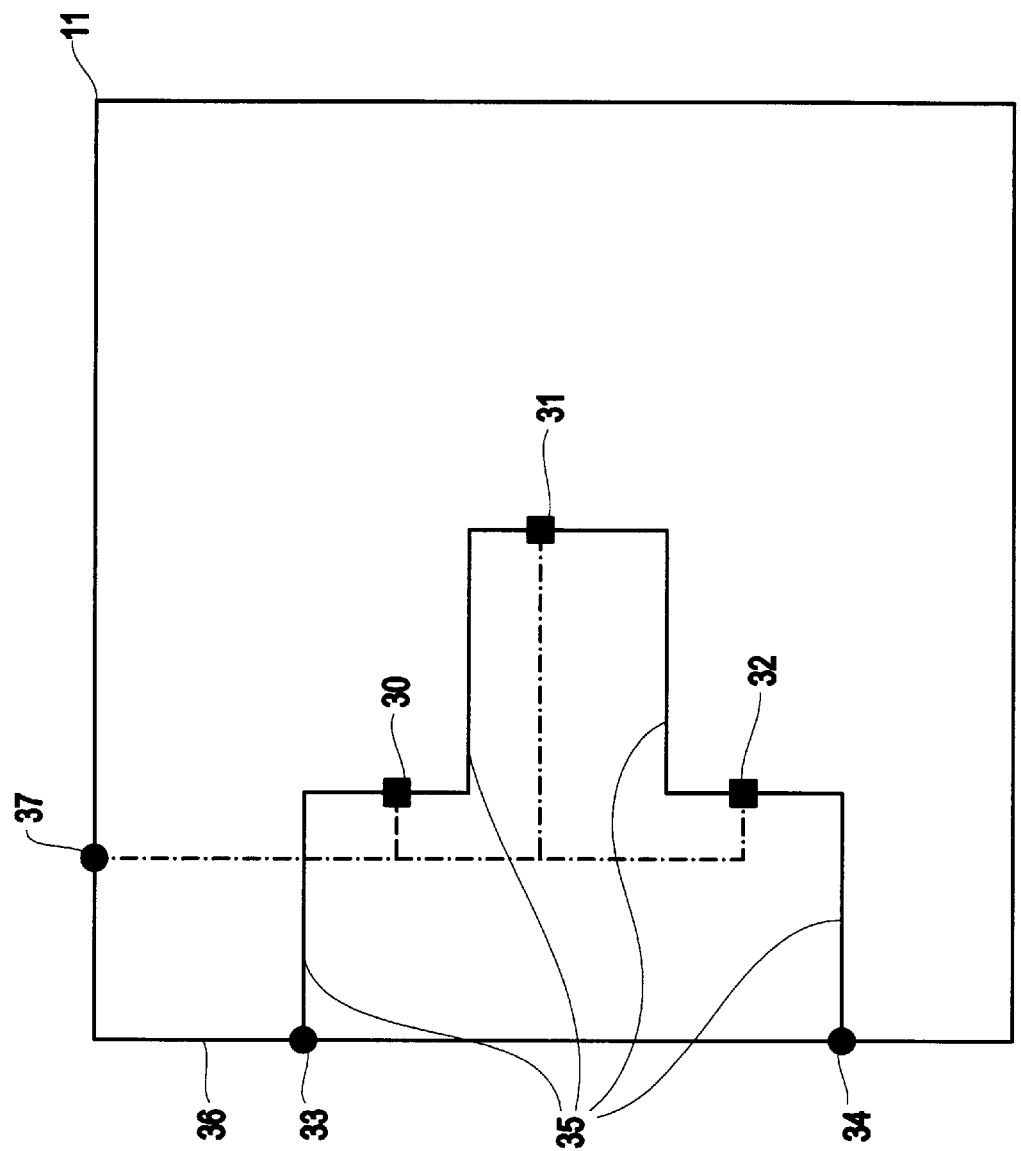
FIG. 3 is a schematic diagram of a chip according to the invention showing latches and a scan chain connecting those latches.
Figure 4:
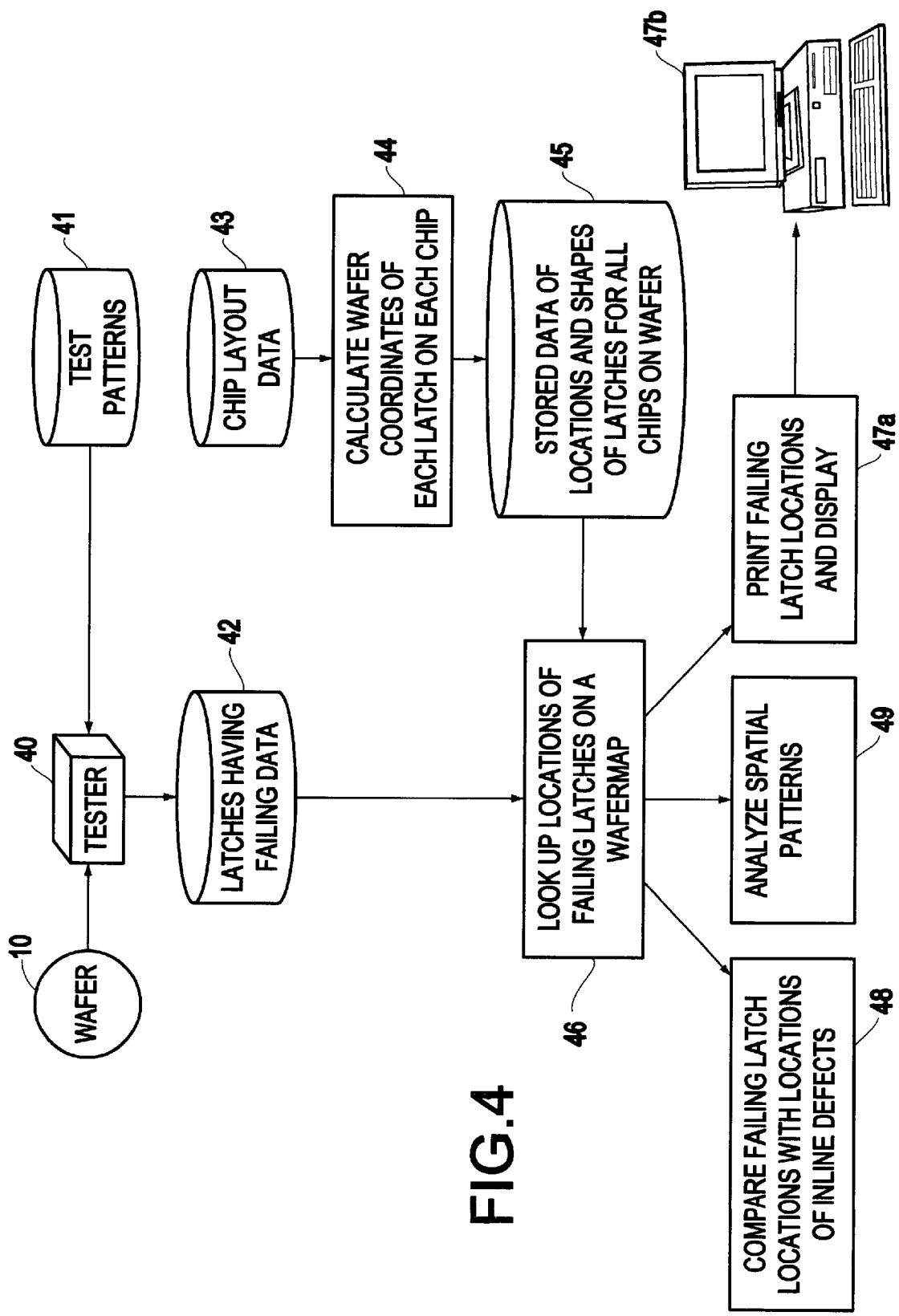
FIG. 4 is a flow diagram illustrating a preferred method of the invention.

As shown in FIGS. 1–4, the pins of the chip 11 on wafer 10 (FIG. 1) are connected by test equipment as shown in item 40 (FIG. 4). The latches 12 (FIG. 1) used in the inventive testing are latches which perform some other function during the normal non-testing operation of the chip. It is merely the way in which the pins of the chip are connected that temporarily converts the latches into "test latches" for receiving and storing data from devices on the chip during the test process. After the testing process is completed and the pins are disconnected from the testing system, the latches which had been used as testing latches will again perform their normal operating function when the chip is placed in service so that the chip performs the function it was originally designed to perform. In other words, the pins of the chip are selectively connected to the testing equipment to temporarily utilize preexisting latches to act as test latches to hold failing data of a defective device on the chip.

Figure 1:
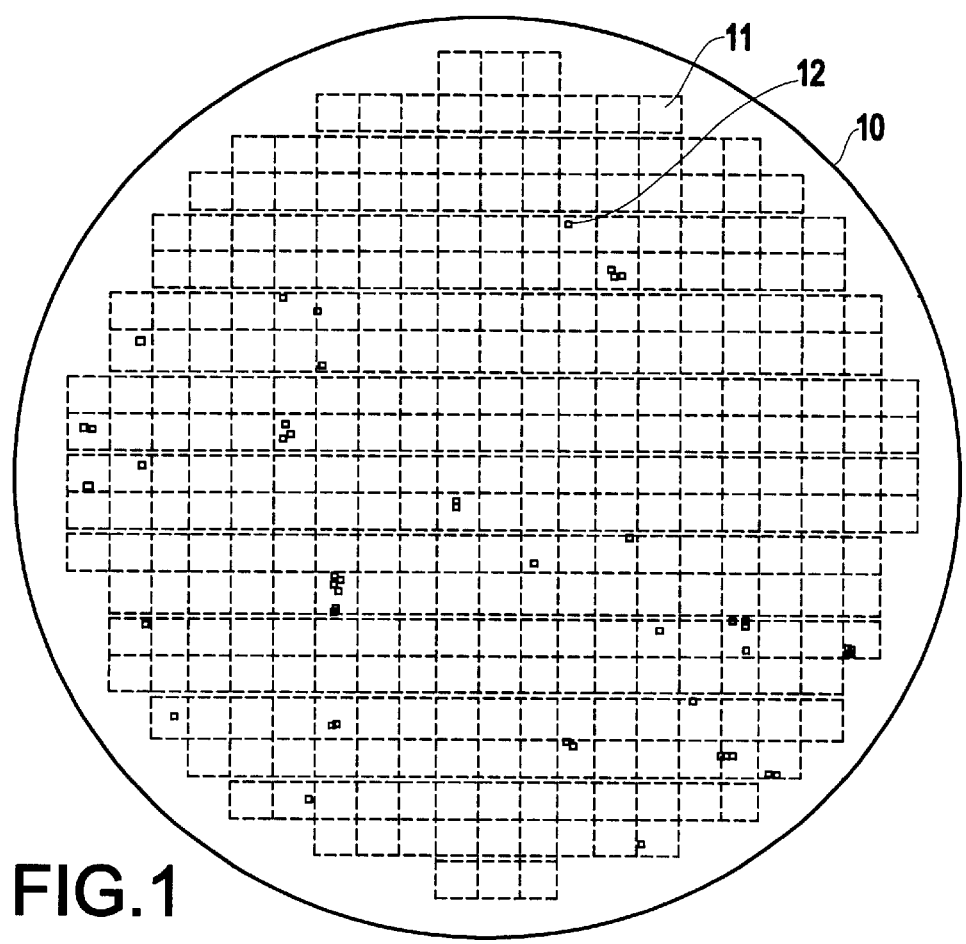
FIG. 1 is a schematic diagram of a wafer according to the invention.

With the invention somewhat accurate full wafer maps can be obtained within minutes. The resulting defect maps can help identify defect categories, thereby improving manufacturing yield and/or yield analysis, etc. Because of the rapid turnaround achieved with the invention, the productivity of test and failure analysis is improved, and the yield learning time is shortened A more detailed description of scan based testing is as follows. In FIG. 1, a wafer 10 is illustrated. The wafer 10 includes chips 11. Each of the chips 11 includes a number of latches 12.

FIGS. 2 and 3 illustrate one of the chips 11 in greater detail. More specifically, FIG. 2 illustrates the latches 12 and other devices 20 (e.g., logic gates, storage devices, etc.) located on the chip. For each latch 12, a region 21–25 is shown that contains the logic devices that, on application of a clock signal to the latch, determine the contents of the latch. Logic devices connected to latch 12 are generally located near latch 12 to facilitate rapid signal propagation and high chip performance during actual chip operation. These devices are generally connected to several latches so regions 21–25 may overlap each other, and, vice versa, many latches may be located within each of the regions 21–25.

In a scan chain type connection of latches shown in FIG. 3, latches 30, 31 and 32 are connected together in a chain connected to scan-in pad 33 and scan-out pad 34. Latches 30, 31 and 32 are electrically connected to each other and to scan-in pads 33 and scan-out pad 34 with wiring 35. Logic elements 20 (FIG. 2), such as NAND gates, NOR gates, inverters, multiplexors, etc. are connected to each latch. The failing data in that latch can be caused by (1) a defect in the latch itself, (2) a defect in a logic element 20 that feeds the latch, or (3) a defect in the clock signal that operates the latch.

A wafer 10 is tested by putting it on a tester 40 and connecting the tester probes to the Input-Output pads of each chip 11 on the wafer in succession or in parallel. In particular, the tester probes are connected to the scan-in and scan-out pads 33 and 34. Once the electrical connections have been made, test patterns 41 are loaded into all the latches along the scan chain through scan-in pad 33 through tester 40. The test data in the latches propagates through the logic elements 20 and may modify the data inputs to each latch. Next one or more system clock signals are applied that stores the modified input values into each latch. Clock signals are applied along clock line 36 from clock pad 37. Clock line 36 is connected to each latch 30, 31 and 32 to store the data on the data input of each latch into each latch simultaneously. Although only one clock line 37 has been illustrated, one of ordinary skill in the art would know that this clock line can represent multiple clock lines. Next, these modified values in the latches 30, 31 and 32 are scanned out to scan-out pad 34 and are observed there by tester. By counting the clock signals, each observed value can be correlated to a specific latch in the scan chain. Any failing data observed at scan-out pad 34 indicates failing data in a specific latch. When, upon inspection, an incorrect value is observed at the scan-out pad 34, a record of the latch having failing data is made in failure database 42 which contains the incorrect data and the latch that had the incorrect data.

The physical locations of all latches 12 within the chip 11 are known from the layout design information 43 of the chip 11. These locations are retrieved from the layout once, before testing begins, the coordinates of each latch are calculated (step 44), and the coordinates are stored in a separate database 45.

Figure 5:
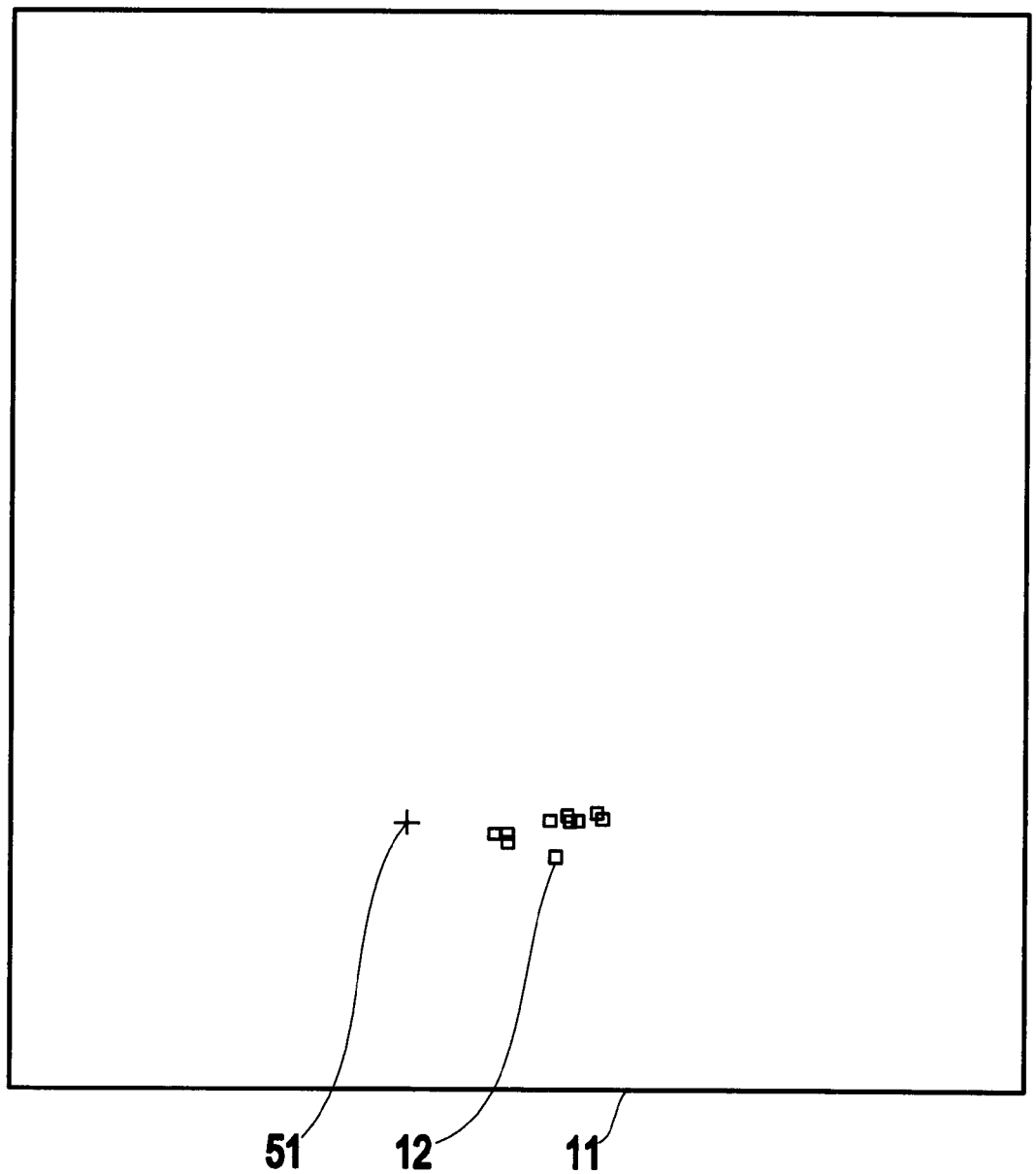
FIG. 5 is a schematic diagram of a fail map according to the invention.

In the next step, a computer program then retrieves the latches with failing data from data base 42 and looks up their chip locations in data base 45. Then these chip locations are transformed into wafer based locations, as shown in step 46. Then those locations are printed on wafer map 50 (step 47a) as shown in FIG. 5. The map can be displayed on computer terminal 47b. Only one chip of such a wafer map is shown in FIG. 5. The latches 12 that contain fail data for chip 11 are shown in map 50. Also shown is the location 51 of the defect, as diagnosed by standard software packages.

A defect 51 in one of the devices 20, or in the latch 12 itself, within chip 11 may result in failing data being stored in the latch 12. This failing data then, in turn, indicates the presence of a defect in any of the devices 20 that control the contents of the latch 12, or in latch 12 itself. The aggregate of all latches 12 that contain failing data provides a rough indication of the location of the defect, this indication being more precise if the latches 12 that contain failing data are more closely clustered together. A possible exception to this correlation is a defect on a clock line. In that case however, a large number of latches may be affected and no clustering will be observed.

In addition to printing wafer map 50 the approximate locations of defects can also be compared with locations of in-line defects obtained during in-line inspection in step 48. Furthermore, the aggrage of approximate locations can also searched for large scale defects, such as scratches, as shown in step 49.

Thus, as shown above, the invention supplies an approximate location where a defective device is located on the chip. This permits a more detailed analysis (e.g., visual inspection, operational testing, etc.) of the chip to be strictly limited to the region where the latch containing the failing data was located. This allows the actual device failure to be identified more quickly and less expensively than with conventional methods so problems can be fixed. Conventionally the entire chip would have had to be analyzed in order to locate the defective device.

Additionally, the invention permits quick and easy formation of approximate fail maps (that is, maps with the location of defects as approximated by the location of latches that contain fail data). More specifically, using the previously known locations of all latches, the latches containing failing data can be mapped to produce a quick and approximate fail map of defective devices. This is especially useful when identifying patterns of device failures.

Therefore, with the invention fail maps from different chips produced during the same manufacturing process can be compared to identify the cause of the defect. The invention is particularly useful, for example, when the defect occurs at the same location in a number of chips. Such a comparison could not be performed economically using conventional methods, because the cost of producing a conventional fail map for multiple chips is very time intensive and resource intensive. To the contrary, the inventive methodology is substantially simplified when compared to conventional methods because the locations of the latches are previously known and easily determined.

While the fail maps produced using the invention are less accurate than conventional fail maps, the inventive fail maps supply sufficient accuracy to limit the portion of the chip which is subject to conventional detailed analysis or to illustrate similarities between patterns of device failures from chip to chip.

Thus, the invention approximates the location of defects, identifies large scale defects (like scratches) identifies if there are defects in the clock (e.g. when there is a large number of latches with fail data, without any obvious spatial clustering), and defects syndromes from the spatial pattern of latches with fail data. For example, the invention can be used for defect identification (as in 31) and recognition of common mode fails (e.g. devices with the same defect syndrome).

While the invention has been described in terms of preferred embodiments, those skilled in the art will recognize that the invention can be practiced with modification within the spirit and scope of the appended claims.

What is claimed is:

1. A method of locating a physical location of a defect in an integrated circuit chip comprising:

identifying exact physical locations of logic latches within said integrated circuit chip;

supplying test signals to said integrated circuit chip, wherein defective portions of said integrated circuit chip produce failing data in said logic latches; and identifying said physical location of said defect in said integrated circuit chip based on physical locations of said logic latches having failing data.

2. The method of claim 1, wherein said logic latch are connected to devices adjacent said logic latches, such that said failing data in said logic latch indicates a failure of at least one device adjacent said logic latch.

3. The method of claim 1, further comprising displaying a map of said physical locations of said logic latch having failing data.

4. The method of claim 1, further comprising determining an area adjacent to at least one of logic latch having failing data.

5. The method of claim 1, further comprising recognizing a pattern of said logic latches having failing data to determine if similar patterns of failing locations occur on other similarly manufactured integrated circuit chips.

6. The method of claim 1, further comprising the step of calculating the physical location of latches from design data before testing, transforming chip based locations of said latches to wafer based locations, looking up the chip based physical location of latches having failing data, and calculating the wafer based location of said latches having failing data.

7. The method of claim 1, further comprising running a scan chain testing procedure to identify said physical locations of said logic latches having failing data.

8. A method of identifying approximate physical locations of defects in an integrated circuit chip, said method comprising:

supplying test signals to said integrated circuit chip, wherein defective portions of said integrated circuit chip produce ailing data in logic latches in response to said test signals;

identifying physical locations of logic lathes that have said failing data; and identifying approximate locations of defects in said integrated circuit chip as those areas that are adjacent to said logic latches that have said failing data.

9. The method of claim 8, wherein said logic latch are connected to devices physically adjacent said logic latches, such that said failing data in said logic latch indicates a failure of at least one device physically adjacent said logic latch.

10. The method of claim 8, further comprising:

calculating said physical locations of said logic latches from design data before supplying said test signals; and transforming chip based locations of said defects to wafer based locations.

11. The method of claim 8, further comprising recognizing a pattern of sad logic latches having failing data to determine if similar patterns of failing locations occur on other similarly manufactured integrated circuit chips.

12. The method of claim 8, wherein said process of identifying physical locations of said physical latches is based on predetermined physical layout design coordinates of said latches.

13. The method of claim 8, wherein said process of identifying physical locations of said latches avoids performing a logical-to-physical conversion of data contained within said latches.

14. A method of identifying approximate physical locations of defects in an integrated circuit chip, said method comprising:

supplying test signals to said integrated circuit chip, wherein defective portions of said integrated circuit chip produce failing data in logic latches in response to said test signals;

identifying physical locations of logic latches that have said failing data; and displaying a map of said physical locations of said logic latch having failing data to graphically identify approximate locations of defects in said integrated circuit chip.

15. The method of claim 14, wherein said logic latch are connected to devices physically adjacent said logic latches, such that said failing data in said logic latch indicates a failure of at least one device physically adjacent said logic latch.

16. The method of claim 14, further comprising calculating said physical locations of said logic latches front design data before supplying said test signals.

17. The method of claim 14, further comprising transforming chip based locations of said defects to wafer based locations.

18. The method of claim 14, further comprising recognizing a pattern of said logic latches having failing data to determine if similar patterns of filing locations occur on other similarly manufactured integrated circuit chips.

19. The method of claim 14, wherein said process of identifying physical locations of said physical latches is based on predetermined physical layout design coordinates of said latches.

20. The method of claim 14, wherein said process of identifying physical locations of said latches avoids performing a logical-to-physical conversion of data contained within said latches.

* * * * *